United States Patent
Guettaf

(10) Patent No.: US 7,441,164 B2
(45) Date of Patent: Oct. 21, 2008

(54) MEMORY BYPASS WITH SUPPORT FOR PATH DELAY TEST

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 507 days.

(21) Appl. No.: 10/329,838

(22) Filed: Dec. 26, 2002

(65) Prior Publication Data

US 2004/0128604 A1 Jul. 1, 2004

(51) Int. Cl.
*G11C 29/00* (2006.01)
*G01R 31/28* (2006.01)

(52) U.S. Cl. .................. 714/718; 714/726; 714/729

(58) Field of Classification Search .............. 714/724, 714/726–729, 718, 719
See application file for complete search history.

(56) References Cited

U.S. PATENT DOCUMENTS

| 5,124,946 | A | * | 6/1992 | Takahashi | .................. 365/195 |
| 5,761,215 | A | * | 6/1998 | McCarthy et al. | ........... 714/726 |
| 6,587,996 | B1 | * | 7/2003 | Reohr et al. | ................... 716/4 |

* cited by examiner

*Primary Examiner*—Jacques Louis-Jacques
*Assistant Examiner*—John J Tabone, Jr.
(74) *Attorney, Agent, or Firm*—McAndrews Held & Malloy Ltd.

(57) ABSTRACT

A method and apparatus are described for testing at least one critical data path in a design of a digital integrated circuit chip during a simulation of the design. A dedicated memory-bypass-enable signal is provided to a memory-bypass-logic circuit of the design during test modes of the simulation. Data content of a memory circuit within the critical data path is protected, using the dedicated memory-bypass-enable signal, during part of a path-delay test mode of the simulation. The memory circuit is also bypassed using the memory-bypass-enable signal during a memory-bypass test mode of the simulation.

12 Claims, 5 Drawing Sheets

-- PRIOR ART --

MEMORY BYPASS WITH SUPPORT FOR PATH DELAY TEST

RELATED APPLICATIONS

U.S. application Ser. No. 10/299,129 entitled "Debug Method for Mismatches Occurring During the Simulation of Scan Patterns", filed on Nov. 19, 2002, is incorporated herein by reference in its entirety.

FEDERALLY SPONSORED RESEARCH OR DEVELOPMENT

[Not Applicable]

[MICROFICHE/COPYRIGHT REFERENCE]

[Not Applicable]

BACKGROUND OF THE INVENTION

Digital integrated circuit chips are composed of many millions of gates that make up various functional components on a chip such as flip-flops, multiplexers, logic circuits, etc. a given chip design may have thousands of flip-flops scattered throughout the chip.

In order to effectively and efficiently test a given chip, certain test features are typically incorporated into the chip design for testing purposes. Before a chip is actually taped out and manufactured, the chip design is first simulated in software using various simulation tools such as, for example, a Verilog Test Bench. By simulating the design of the chip, the design features of the chip may be thoroughly tested before the expense and time of actually manufacturing the chip is incurred.

Pattern verification is a critical phase in testing of chips. A scan pattern is a digital string of binary ones and zeros that may be shifted through a scan chain of flip-flops in the chip design. Every scan pattern cycle is composed of two phases. The first phase is the load_unload phase where new data is shifted into the scan chains of flip-flops. The second phase is the capture phase where the data is captured into the flip-flops by adding a clock pulse.

Chip designs contain much logic circuitry (logic clouds) around memory circuits. The memory circuits are often bypassed during testing of the design during simulation in order to efficiently test data paths that inlcude the logic clouds around the memory circuits. Testing data paths while including the memory circuits may be difficult because the memory circuits often comprise large arrays of elements.

FIG. 1 illustrates a part of a chip design 5 comprising a memory-bypass-logic circuit 40 used to bypass a memory circuit 30 of the chip design during a scan test mode of the simulation. Typically, a global scan-test-mode signal 45 is used to select the bypass path throgh the memory-bypass-logic circuit 40. The global scan-test-mode signal is driven by a test staion that puts the simulation in the scan test mode. The global scan-test-mode signal is used throughout the design during the scan test mode.

Referring to FIG. 1, data is shifted through a first flip-flop 10 and passes through a first logic cloud 20. The data out of the first logic cloud 20 (i.e., input data to the memory circuit 30) is captured in the memory-bypass-logic circuit 40 and passed to the output logic cloud 60 on the output side of the memory circuit 30, thus bypassing the memory circuit 30 during testing of the scan path.

It is desirable, however, to test certain critical paths through the chip design, which contain memory circuits, during simulation in a path-delay test mode in such a way that memory bypass capability is still supported.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method is provided for testing at least one critical data path in a design of a digital integrated circuit chip during a simulation of the design. A dedicated memory-bypass-enable signal is provided to a memory-bypass-logic circuit of the design during certain test modes of the simulation. Data content of a memory circuit within the critical data path is protected, using the dedicated memory-bypass-enable signal, during part of a path-delay test mode of the simulation. The memory circuit is also bypassed using the memory-bypass-enable signal during a memory-bypass test mode of the simulation.

Apparatus is provided to test at least one critical data path in a design of a digital integrated circuit chip during a simulation of the design. The apparatus comprises at least one memory-bypass-logic circuit to bypass at least one memory circuit within the critical data path during a memory-bypass test mode of the simulation. At least one logic gate is provided that is driven by a dedicated memory-bypass-enable signal and is connected to the memory circuit to control writing to the memory circuit during at least a path-delay test mode of the simulation.

These and other advantages and novel features of the present invention, as well as details of an illustrated embodiment thereof, will be more fully understood from the following description and drawings.

DETAILED DESCRIPTION OF THE INVENTION

Aspects of the present invention provide a method and apparatus to test at least one critical data path, having a memory circuit, in a design of a digital integrated circuit chip during a simulation of the design while still supporting memory-bypass capability.

Figure 2:
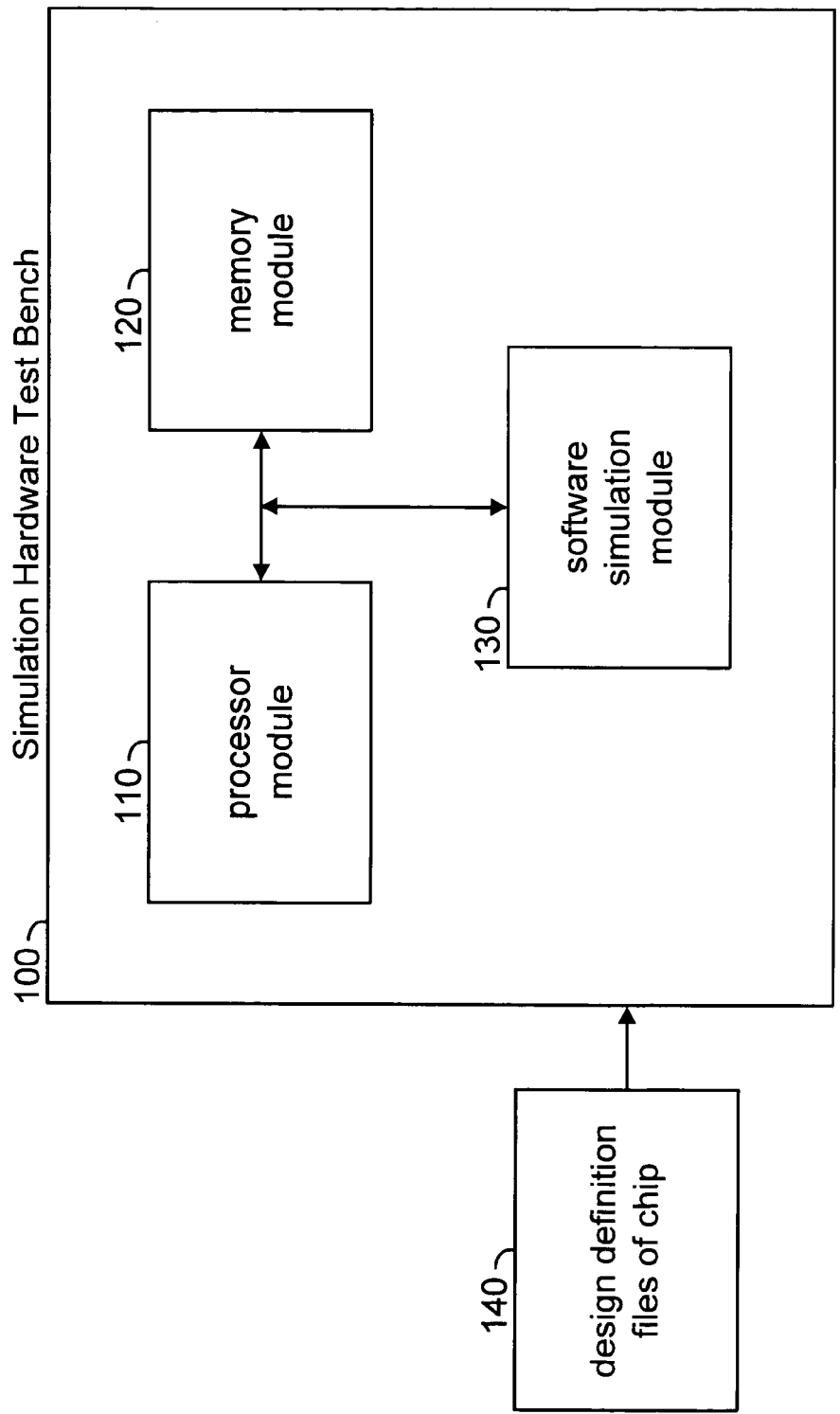
FIG. 2 is a schematic diagram of a simulation hardware test bench used in testing the simulated chip design of FIG. 1 in accordance with an embodiment of the present invention.

Referring to FIG. 2, in an embodiment of the present invention, a simulation hardware test bench 100 is used to test the design of a digital integrated circuit chip. The simulation hardware test bench 100 may comprise at least one processor module 110, at least one memory module 120, and at least one software simulation module 130. A set of design definition files 140 of the chip is loaded into the simulation hardware test bench 100 and is operated on by at least one software simulation module 130 using at least one processor module 110 and at least one memory module 120. In an embodiment of the present invention, the set of design definition files 140 comprises a set of computer files that completely defines the design of the chip including all flip-flops, logic clouds, memory, and timing. The simulation hardware test bench 100 supports at least combinational testing (scan test mode) and at-speed critical path testing through memories (path-delay mode) of the chip design.

Figure 3:
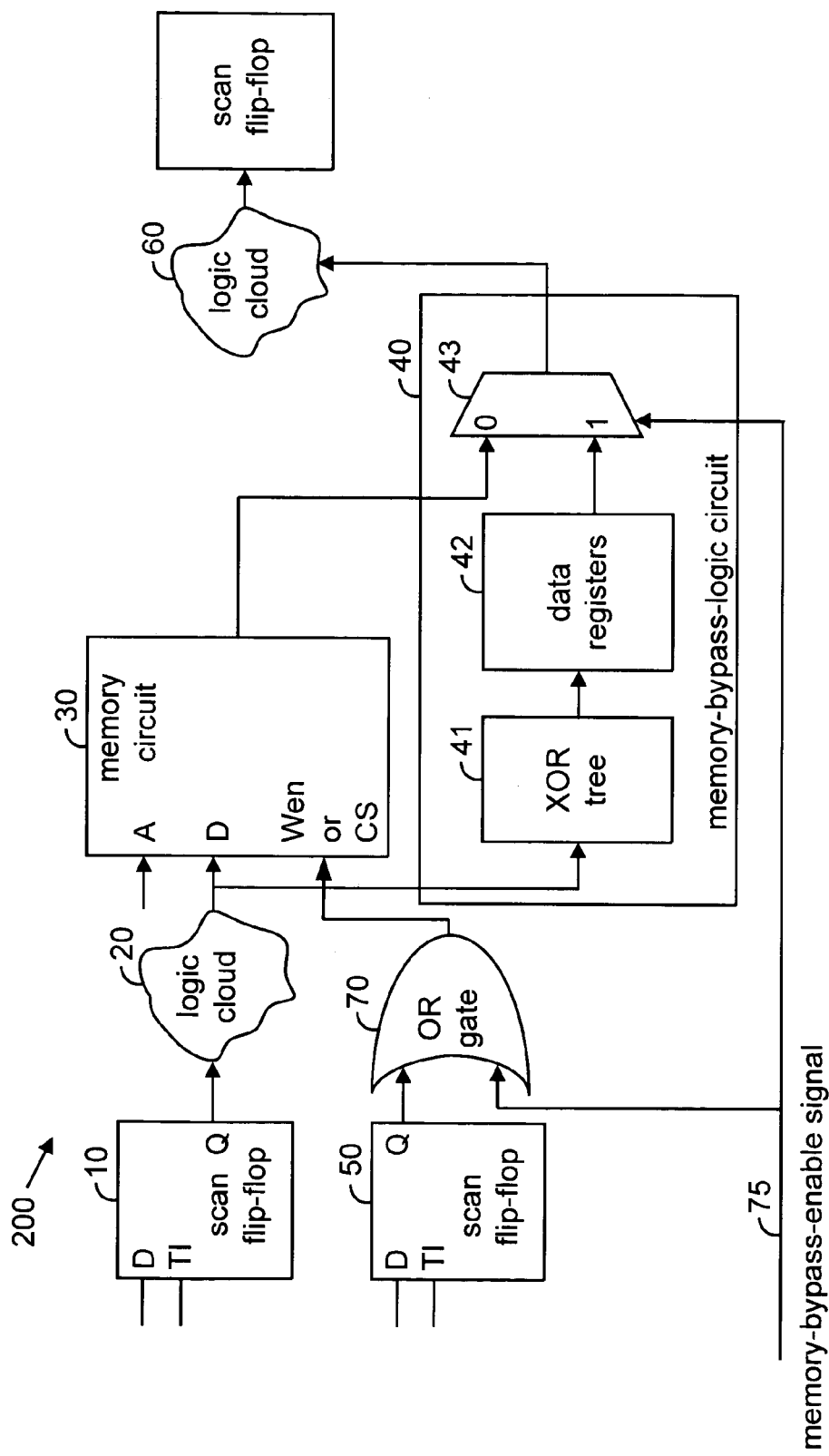
FIG. 3 is an exemplary illustration of part of a chip design providing a dedicated memory-bypass-enable signal used to protect the data content of a memory circuit of the design during simulated testing of the design in accordance with an embodiment of the present invention.

FIG. 3 is an exemplary illustration of part of a chip design 200 providing a dedicated memory-bypass-enable signal 75 used to protect the data content of a memory circuit 30 of the design during simulated testing of the design in accordance with an embodiment of the present invention. However, the circuitry of FIG. 3 is an actual and final part of the design of the chip, not just a part of the simulation.

In an embodiment of the present invention, for any critical data path of the design that includes at least one memory circuit 30, the design provides logic cloud 20 connected between a scan flip-flop 10 and the memory circuit 30. An OR gate 70 is connected between another scan flip-flop 50 and the memory circuit 30. A memory-bypass-logic circuit 40 is connected between an output of the logic cloud 20 and an input of another logic cloud 60. The output of memory circuit 30 also connects to memory-bypass-logic circuit 40. The OR gate 70 is driven by the dedicated memory-bypass-enable signal 75 and the output of scan flip-flop 50 to control writing to the memory circuit 30. The dedicated memory-bypass-enable signal 75 is also used to decide whether or not the data provided to the input of logic cloud 60 comes directly from logic cloud 20 or first passes through memory circuit 30. Previously, the memory bypass decision was made using the global scan-test-mode signal 45. The dedicated memory-bypass-enable signal 75 is provided through a pad (port) of the chip design during testing.

During simulation testing of the chip design, data may be shifted into scan flip-flop 10 during a shift mode of the simulation. In a capture mode of the simulation, the output of scan flip-flop 10 is stable and appears at the input to logic cloud 20. The data at the output of logic cloud 20 may be written to memory circuit 30 (in a path-delay mode of the simulation) or captured in memory-bypass-logic circuit 40 (in a scan-test mode of the simulation). In an embodiment of the present invention, memory-bypass-logic circuit 40 comprises an XOR tree 41, data registers 42, and multiplexer 43.

In the scan-test mode (also known as the memory-bypass test mode), during simulation of the chip design with the simulation hardware test bench 100, the memory circuit 30 may be bypassed by asserting the memory-bypass-enable signal 75. The memory-bypass-enable signal 75 switches the multiplexer 43 to pass the data, from the output of the logic cloud 20 that was captured in the data registers 42, to the logic cloud 60. As a result, the data to the logic cloud 60 has bypassed the memory circuit 30. Therefore, the memory-bypass-logic circuit supports scan mode testing through a chain of scan flip-flops with logic clouds in between without having to deal with any memory circuits in the path.

However, in the path-delay test mode, data from the logic cloud 20 is written to the memory circuit 30 and is then read from the memory circuit 30 either directly at the output of memory circuit 30 or at the output of logic cloud 60 at normal operational speed. Therefore, the path delay and accuracy of the data through the critical path may be analyzed as part of the simulation testing. In an embodiment of the present invention, the simulation hardware test bench 100 executes a path-delay algorithm to generate data patterns to be clocked through the critical data paths having memory during the path-delay test mode.

Figure 4:
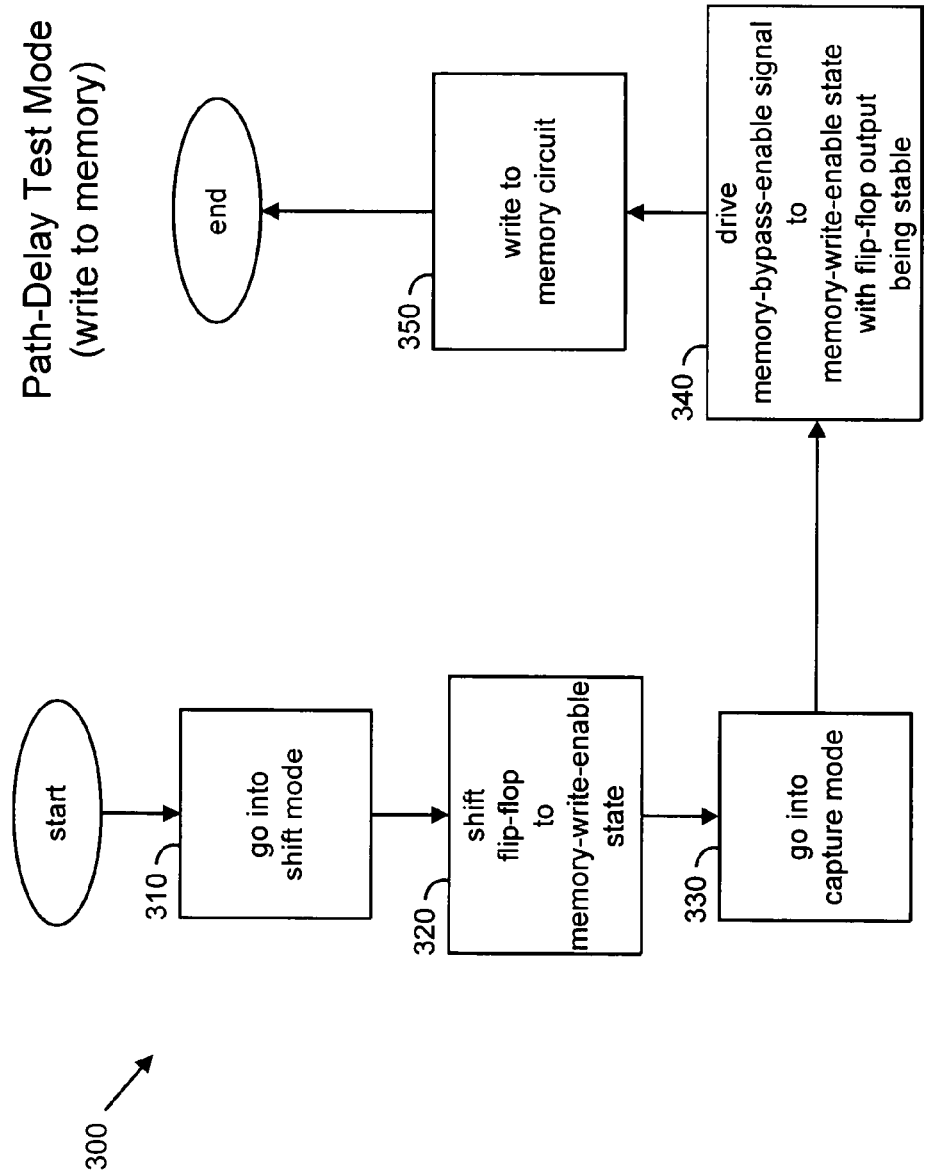
FIG. 4 is a flowchart of a method to write to the memory circuit of FIG. 3 during a path-delay test mode in a simulation of a chip design in accordance with an embodiment of the present invention.

Referring to FIG. 4, a method 300 describes how to write data content to memory circuit 30 in the path-delay test mode in accordance with an embodiment of the present invention. In step 310 the simulation is put into a shift mode. In step 320, data is shifted into scan flip-flop 10 until the output Q is put in the memory-write-enable state (i.e., logic zero). In step 330, the simulation enters a capture mode such that the output Q of scan flip-flop 10 is stable in the memory-write-enable state.

In step 340, the dedicated memory-bypass-enable signal 75 is driven to the memory-write-enable state (i.e., logic zero) by the simulation hardware test bench 100. As a result, the output of OR gate 70 is a logic zero and the input to write enable (Wen) or chip select (CS) of the memory circuit 30 is a logic zero also. Therefore, the memory circuit 30 is enabled for being written to. In step 350, the data from the output of logic cloud 20 at data input, D, is written to memory circuit 30 at the address presented at address input, A, by clocking the memory circuit 30.

Figure 5:
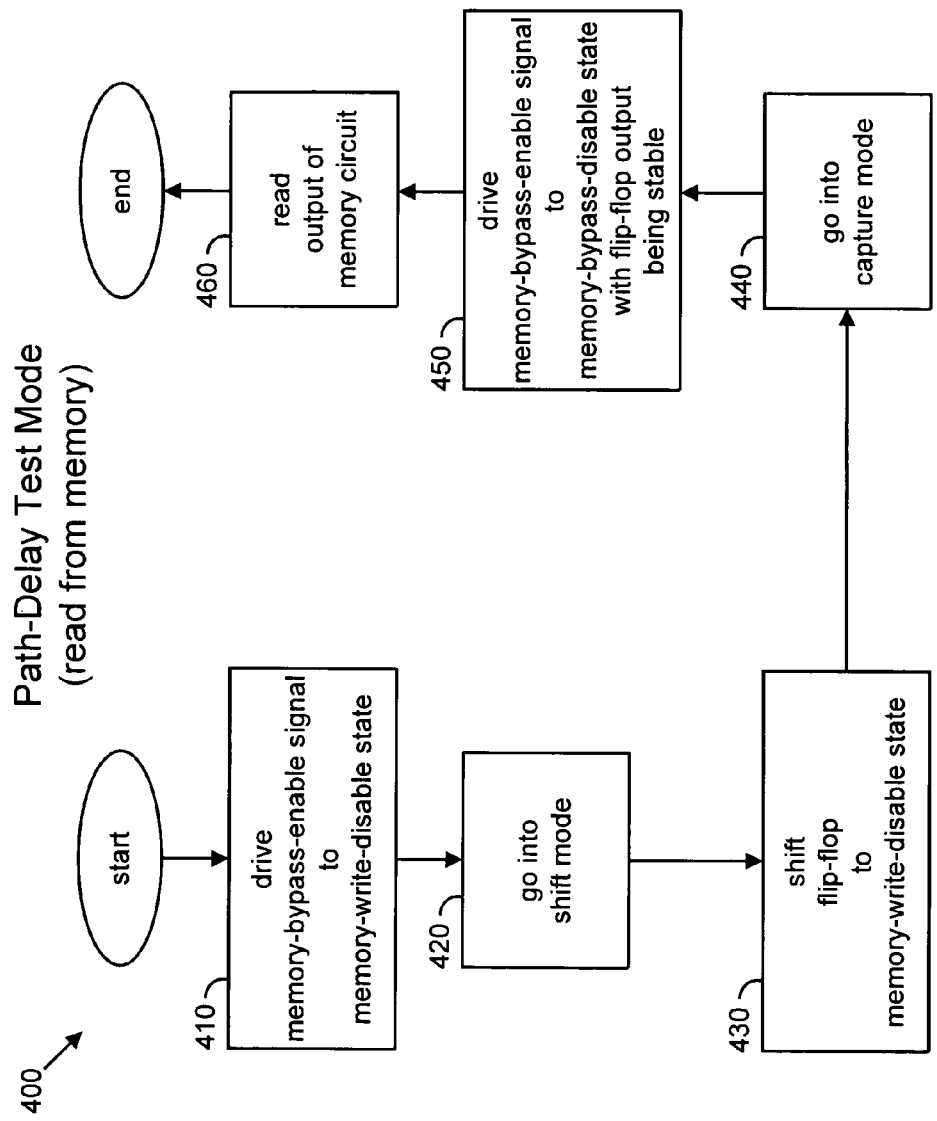
FIG. 5 is a flowchart of a method to read from the memory circuit of FIG. 3 during a path-delay test mode in a simulation of a chip design in accordance with an embodiment of the present invention.

Referring to FIG. 5, a method 400 describes how to read data content from memory circuit 30 in the path-delay test mode in accordance with an embodiment of the present invention. In step 410, the dedicated memory-bypass-enable signal 75 is driven to the memory-write-disable state (i.e., logic one). The logic one passes through the OR gate 70 to the Wen (or CS) input of memory circuit 30 and disables the memory circuit 30 from being written. As a result, the data contents of the memory circuit are protected. In other words, the data contents that were written in step 350 in method 300 may be preserved by asserting memory-bypass-enable signal 75.

In step 420, the simulation enters a shift mode. In step 430, data is shifted into scan flip-flop 50 until the output Q of scan flip-flop 50 is put in a memory-write-disable state (i.e., logic one). During the shift mode, the scan flip-flop 10, logic cloud 20, or memory circuit 30 may be clocked many times and data and addresses presented to the memory circuit 30 may be changing. However, since the memory-bypass-enable signal is still asserted, the data contents of the memory circuit 30 are protected.

The simulation then enters the capture mode in step 440 and the output Q of scan flip-flop 50 becomes stable. As a result, a logic one still appears at the Wen (or CS) input to memory circuit 30 and the data contents are still protected (i.e., the data content has not changed during the shift mode due to any clocking of scan flip-flop 10, logic cloud 20, or memory circuit 30 during the shift mode.

In step 450, the memory-bypass-enable signal is now driven to a memory-bypass-disable state (logic zero) such that the output of memory circuit 30 (i.e., the protected data content) is routed through multiplexer 43 to logic cloud 60. In step 460, the simulation may read the data at the input or output of logic cloud 60 and a path-delay time may be generated based on the time it takes to perform the steps of writing to and reading from memory circuit 30 (i.e., methods 300 and 400). In the path-delay test mode, the critical path is tested at normal operational speed through the memory circuit in accordance with an embodiment of the present invention.

Figure 1:
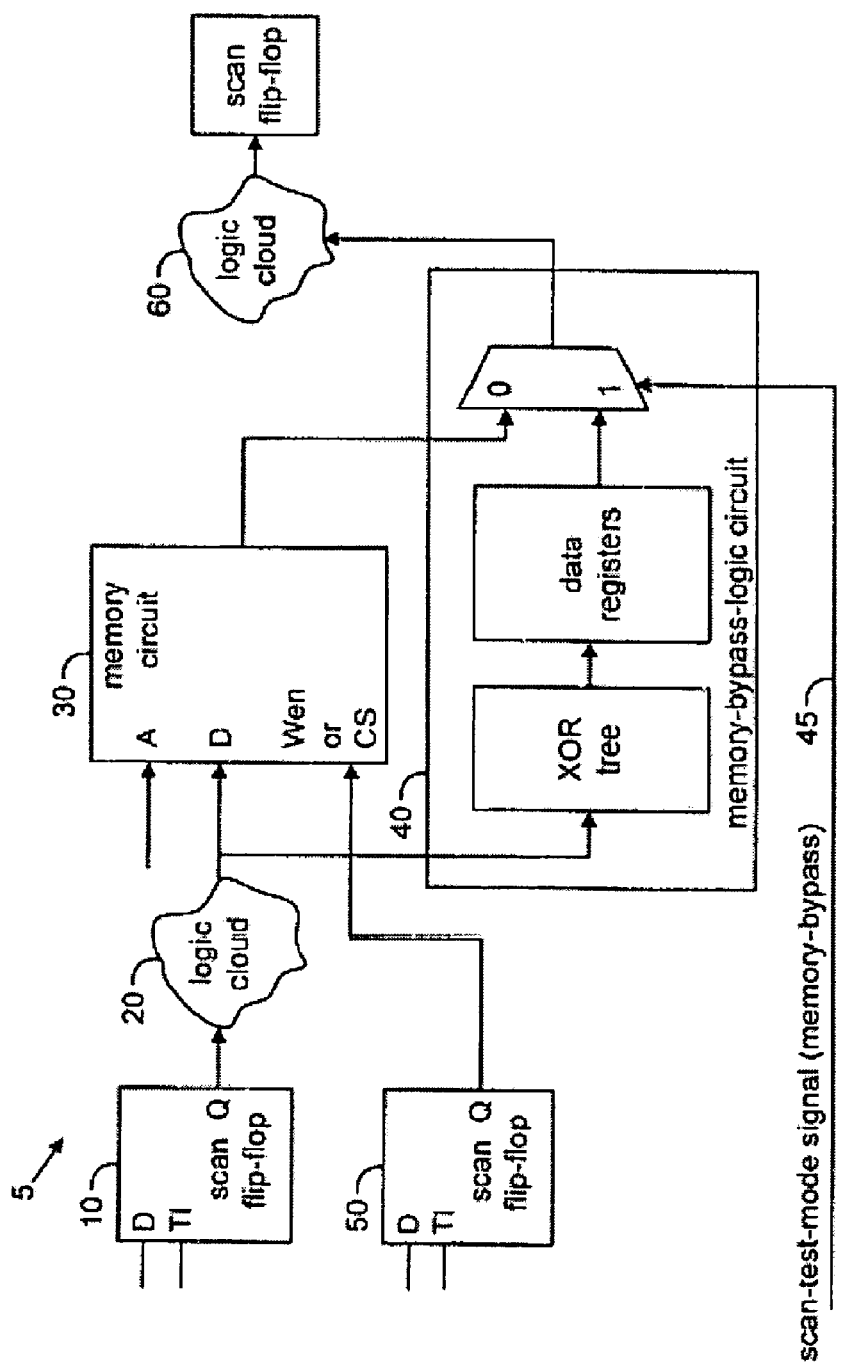
FIG. 1 is an exemplary illustration of a part of a chip design comprising a memory-bypass-logic circuit used to bypass a memory circuit of the chip design during a scan test mode of a simulation of the chip design.

It is clear from the foregoing discussion that the dedicated memory-bypass-enable signal, in conjunction with the memory-bypass-logic circuit, support both the scan-test mode (memory-bypass test mode) and the path-delay test mode in accordance with an embodiment of the present invention. In an embodiment of the present invention, the scan-test-mode signal 45 (see FIG. 1) is no longer global. The scan-test-mode signal 45 no longer controls the memory-bypass-logic circuit 40 but, instead, is only used to put certain other circuitry in the scan-test mode as before.

It is also clear that a memory-bypass-disable state and a memory-write-enable state of the dedicated memory-bypass-enable signal 75 are represented by the same logic state. Also, a memory-bypass-enable state and a memory-write-disable state of the dedicated memory-bypass-enable signal 75 are represented by the same logic state.

In alternative embodiments of the present invention, certain elements may be combined or separated. For example, the OR gate 70 may be integrated to become part of the memory-bypass-logic circuit 40. Also, in other embodiments of the present invention, the memory-bypass-logic circuit 40 may be implemented using other combinations of circuitry to capture the data other than the XOR tree, data registers, and multiplexer.

In summary, aspects of the present invention provide for supporting both a scan-test mode and a path-delay test mode for testing certain critical paths in a simulation of a design of a digital integrated circuit chip. Testing of data paths comprising scan flip-flops, logic clouds and memory circuits are supported along with memory-bypass-logic circuitry.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method to test at least one critical data path in a design of a digital integrated circuit chip during a simulation of said design, said method comprising:
   shifting an output of a flip-flop of said design to a memory-write-enable state;
   driving a dedicated memory-bypass-enable signal of said design to a memory-bypass-disable state;
   inputting said dedicated memory-bypass-enable signal and said output of said flip-flop to a logic gate to enable writing to at least one memory circuit of said design;
   writing from a data signal to said at least one memory circuit of said design while measuring an at-speed write delay time; and
   driving said dedicated memory-bypass-enable signal to a memory-bypass-enable state to protect said at least memory circuit while said data signal bypasses said at least one memory circuit.

2. The method of claim 1 further comprising:
   shifting said output of said flip-flop to a memory-write-disable state;
   driving said dedicated memory-bypass-enable signal to said memory-bypass-disable state while said output of said flip-flop is stable;
   inputting said dedicated memory-bypass-enable signal and said output of said flip-flop to said logic gate to enable reading data contents from an output of said at least-one memory circuit; and
   reading said data contents from said output of said-at least one memory circuit while measuring an at-speed read delay time.

3. The method of claim 1 wherein the at-speed write delay time is an element of a path-delay test for testing said at least one critical data path though said at least one memory circuit at normal operational speed.

4. The method of claim 1 comprising:
   scan mode testing said at least one critical data path while said data contents of said at least one memory circuit are protected.

5. A simulator for testing memory in an integrated circuit, wherein a method of simulation comprises:
   shifting an output of a scan flip-flop in the integrated circuit to a memory-write-enable state, thereby stabilizing the output of said scan flip-flop;
   driving a dedicated memory-bypass-enable signal to a memory-bypass-disable state;
   inputting said dedicated memory-bypass-enable signal and said output of said scan flip-flop to a logic gate, thereby enabling the writing to said memory;
   writing to said memory from a data signal while measuring an at-speed write delay time; and
   driving said dedicated memory-bypass-enable signal to a memory-bypass-enable state, thereby bypassing said memory and disabling the writing to said memory, wherein said data signal is available at the output of said memory.

6. The simulator of claim 5 further comprising:
   shifting said output of said scan flip-flop to a memory-write-disable state, thereby stabilizing the output of said scan flip-flop;
   driving said dedicated memory-bypass-enable signal to said memory-bypass-disable state;
   inputting said dedicated memory-bypass-enable signal and said output of said scan flip-flop to said logic gate to enable reading from said memory; and
   reading from said memory while measuring an at-speed read delay time.

7. The simulator of claim 5, wherein the at-speed write delay time is an element of a path-delay test for testing at least one critical data path through said memory at normal operational speed.

8. The simulator of claim 5, wherein the scan mode test is an element of a memory-bypass test for testing at least one critical data path while bypassing said memory.

9. A method of testing in an integrated circuit, the method comprising:
   stabilizing an output of a scan flip-flop in the integrated circuit to logic state zero;
   driving a signal to logic state zero;
   performing an OR operation with the signal and the output of the scan flip-flop, thereby generating an OR operation output at logic state zero to enable memory writing;
   writing to the memory while measuring an at-speed write delay time;
   driving the signal to logic state one, thereby generating said OR operation output at logic state one to bypass said memory and disable memory writing; and
   performing a scan mode test.

10. The method of claim 9 further comprising:

stabilizing the output of the scan flip-flop in the integrated circuit to logic state one;

driving the signal to logic state zero, thereby generating said OR operation output at logic state one to disable memory writing and enable memory reading; and reading from the memory while measuring an at-speed read delay time.

11. The method of claim 9, wherein the at-speed write delay time is an element of a path-delay test for testing at least one critical data path though said memory at normal operational speed.

12. The method of claim 9, wherein the scan mode test is an element of a memory-bypass test for testing at least one critical data path while bypassing said memory.

* * * * *